(12) United States Patent
Meier et al.

(10) Patent No.: US 7,760,505 B2
(45) Date of Patent: Jul. 20, 2010

(54) POWER SEMICONDUCTOR MODULE

(75) Inventors: Markus Meier, Rieden (DE); Bertrand Viala, Karlsruhe (DE); Stephan Jonas, Neunburg (DE)

(73) Assignee: Siemens Aktiengesellschaft, Munich (DE)

( * ) Notice: Subject to any disclaimer, the term of this patent is extended or adjusted under 35 U.S.C. 154(b) by 219 days.

(21) Appl. No.: 12/068,174

(22) Filed: Feb. 4, 2008

(65) Prior Publication Data
US 2008/0217757 A1 Sep. 11, 2008

(30) Foreign Application Priority Data
Feb. 5, 2007 (EP) .................................. 07002434

(51) Int. Cl.
*H05K 7/20* (2006.01)
(52) U.S. Cl. ............... 361/707; 257/712; 257/E23.083
(58) Field of Classification Search ............... 257/684, 257/688, 689, 691, 712, 713, 717, 718, 719, 257/723, 724, 726, E23.001, E32.002, E23.08, 257/E23.083, E23.094, E23.104; 361/688, 361/707
See application file for complete search history.

(56) References Cited

U.S. PATENT DOCUMENTS 4,246,597 A * 1/1981 Cole et al. .................. 257/713

2005/0230820 A1 * 10/2005 Licht ......................... 257/720

FOREIGN PATENT DOCUMENTS

| DE | 3323246 A1 | 1/1985 |
|---|---|---|
| DE | 3508456 C2 | 1/1987 |
| DE | 10 2005 047 547 | 4/2007 |
| EP | 0020911 A2 | 1/1981 |
| EP | 1083503 B1 | 3/2001 |
| EP | 1650800 A2 | 4/2006 |
| WO | WO 03034467 A2 | 4/2003 |

* cited by examiner

*Primary Examiner*—Matthew C Landau
*Assistant Examiner*—Daren Wolverton
(74) *Attorney, Agent, or Firm*—Harness, Dickey & Pierce, P.L.C.

(57) ABSTRACT

A power semiconductor module is disclosed, including a plate-type substrate fitted with at least one component, and a base plate provided for dissipating heat from the component via the substrate. In at least one embodiment, a supporting apparatus, which keeps the substrate in thermal contact with the base plate, has a central pressure bolt adjoined by a plurality of stamps which extend in different directions and are intended to contact-connect the substrate, the individual stamps being at non-uniform distances from the substrate in the mechanically unloaded state of the pressure bolt.

18 Claims, 2 Drawing Sheets

POWER SEMICONDUCTOR MODULE

PRIORITY STATEMENT

The present application hereby claims priority under 35 U.S.C. §119 on European patent application number EP07002434 filed Feb. 5, 2007, the entire contents of which is hereby incorporated herein by reference.

FIELD

Embodiments of the invention generally relate to a power semiconductor module. For example, the may relate to one including a substrate which is fitted with at least one component and is kept in thermal contact with a cooling element by way of a supporting apparatus.

BACKGROUND

DE 33 23 246 A1 discloses a power semiconductor module having a metal base plate as the cooling element, which base plate is adhesively bonded to a substrate, namely a ceramic plate which has been metallized on both sides, with the aid of an elastic adhesive thermally conductive paste. A plastic housing of the power semiconductor module has struts with supports which are intended to counteract deformation of the substrate. However, the struts and supports require a considerable amount of installation space which is thus no longer available for fitting components to the substrate.

A power semiconductor module which is disclosed in DE 35 08 456 C2 likewise has struts which mechanically interact with a ceramic substrate. Threaded holes for screwing in adjusting screws are provided in the struts. The adjusting screws press on intermediate pieces which are made of plastic, for example glass-fiber-reinforced thermosetting plastic, and are adhesively bonded to the substrate or to a component. An intermediate piece arranged on a thyristor or a circular copper blank has a slot for passing a connecting clip through to the thyristor gate.

A further power semiconductor module which is disclosed in EP 1 083 503 B1 has a base plate which is suitable for dissipating heat and has a substrate, which is fitted with power semiconductor chips, arranged on it, said substrate being able to be pressed onto the base plate using pressure elements. The pressure elements have conductive connecting elements which are arranged between the substrate and contact rails and are in the form of contact cords which have an elastic core and an electrically conductive sheath. The contact cords require a considerable amount of free space on the substrate.

SUMMARY

In at least one embodiment, the invention specifies a power semiconductor module in which a substrate which is fitted with a heat-generating component is connected to a cooling element in a particularly space-saving and installation-friendly manner.

According to an embodiment of the invention, a power semiconductor module has a plate-type substrate, in particular a direct copper bonding (DCB) substrate, which is fitted with at least one component, as well as a base plate which is provided for the purpose of dissipating heat from the component via the substrate. In this case, a base plate is understood as meaning any part which dissipates heat and has a surface on which the substrate rests directly or indirectly, for example using a thermally conductive paste. A supporting apparatus is designed to keep the substrate in thermal contact with the base plate. This supporting apparatus is elastic and comprises a central pressure bolt which extends normal to the substrate and is adjoined by a plurality of stamps which extend in different directions and are intended to contact-connect the substrate, the individual stamps being at non-uniform distances from the substrate surface in the mechanically unloaded state of the pressure bolt.

The stamps, in at least one embodiment, comprise a central stamp which is identical to, or aligned with, the pressure bolt as well as at least two lateral stamps which extend essentially orthogonal to the pressure bolt, are elastic per se and/or are connected to the pressure bolt in an elastically resilient manner. The last-mentioned stamps may be arranged in a rotationally symmetrical manner with respect to a geometrical axis described by the pressure bolt. In the case of only two lateral stamps, the supporting apparatus may be distinguished by a very narrow design overall, whereas more extensive support can be achieved with a larger number of stamps. In all cases, when the power semiconductor module is ready for operation, the pressure bolt is loaded with a force, which acts on the substrate in a perpendicular direction, in such a manner that all of the stamps transfer a force between the pressure bolt and the substrate.

The central stamp and the lateral stamps can be integrally produced with the pressure bolt, for example in a plastic injection-molding method. If a housing of the power semiconductor module is likewise fabricated from plastic, it is also possible to integrally form the entire supporting apparatus with the housing or a housing part, for example a housing cover.

The force with which the supporting apparatus presses onto the flat substrate can preferably be set, for example using a setting screw. Additionally or alternatively, the supporting apparatus can be elastically mounted on the side facing away from the substrate. A leaf spring or a rail which is elastic at least to a slight extent is suitable for this purpose, for example.

According to one example refinement, a plurality of lateral stamps of the supporting apparatus are arranged in the mechanically unloaded state of the latter, that is to say without the action of force when the supporting apparatus rests on the substrate, in such a manner that only those regions of the lateral stamps—a respective single point in the extreme theoretical case—which are furthest away from the axis of the supporting apparatus, that is to say from the axis of symmetry of the pressure bolt, come into abutment against the substrate. The distance between the substrate and the individual lateral stamps (also referred to as legs) increases toward said axis. Expressed in simplified terms, this means that the legs of the supporting apparatus are placed such that they are at least slightly oblique with respect to the surface of the substrate. The same also applies in cases in which the supporting apparatus is not supported on the substrate directly but rather on a component, for example.

In a different respect, an embodiment in which at least the lateral stamps, preferably all stamps, have a V-shaped cross section is advantageous, only one edge of each stamp being intended to rest on the substrate. The narrow, virtually linear contact regions between the substrate and the stamps of the supporting apparatus mean that particularly good use is made of the elastic material properties of the preferably integral supporting apparatus. The cross section of the stamps which widens with increasing distance from the substrate also makes it possible to apply a relatively large force to the substrate in the case of a supporting apparatus which is fabricated from plastic. At the same time, the supporting apparatus can be integrated in the power semiconductor module in a space-saving manner. Overall, taking into account the elastic material properties of the stamps, in particular, the supporting apparatus can be configured in such a manner that, during operation of the power semiconductor module, all stamps load the substrate with a pressure which is uniform both inside each individual stamp and, in contrast, between the stamps.

The supporting apparatus is preferably in the form of an electrically insulating component overall. Plastics are particularly suitable for producing the supporting apparatus in this aspect too. If electrical conductivity of the supporting apparatus is required in the individual case, this can be produced, for example, from a polymer material with a metal sheath.

The power semiconductor module is a motor soft starter, for example. Semiconductor relays or semiconductor contactors can likewise be implemented as power semiconductor modules according to an embodiment of the invention. An advantage of an embodiment of the invention is, in particular, that a supporting apparatus having elastically resilient stamps which taper toward a flat substrate makes it possible to apply force in a particularly uniform manner and at the same time requires only a small amount of area on the substrate which is otherwise intended to be fitted with power semiconductors.

BRIEF DESCRIPTION OF THE DRAWINGS

One example embodiment of the invention is explained in more detail below using drawings, in which.

DETAILED DESCRIPTION OF THE EXAMPLE EMBODIMENTS

Figure 1:
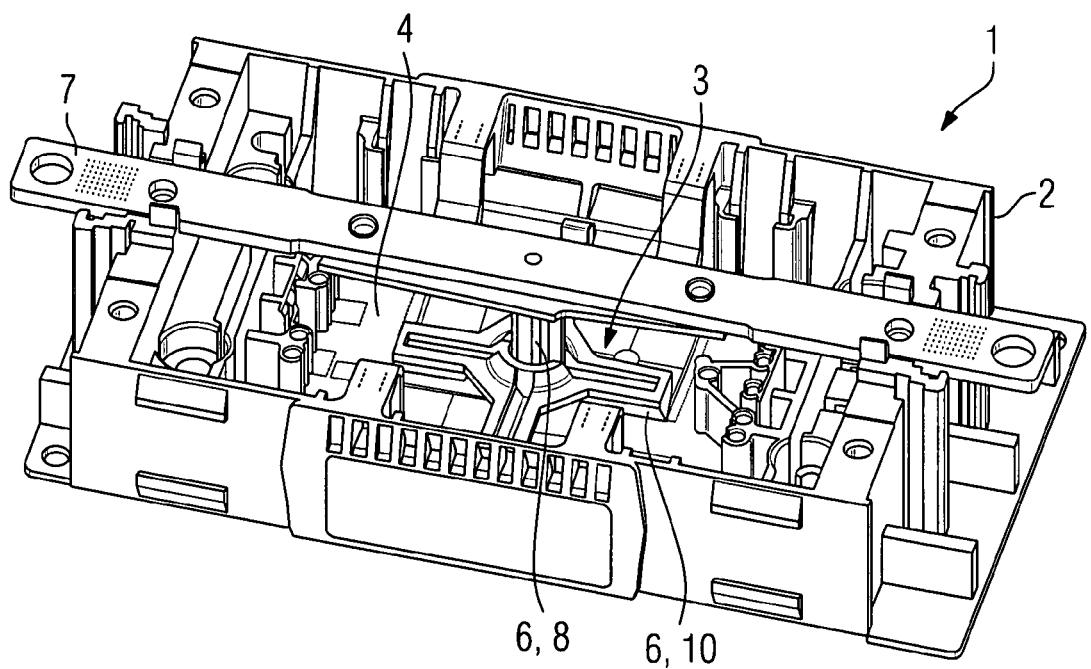
FIG. 1 shows a perspective view of a power semiconductor module having a supporting apparatus.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

Figure 3:
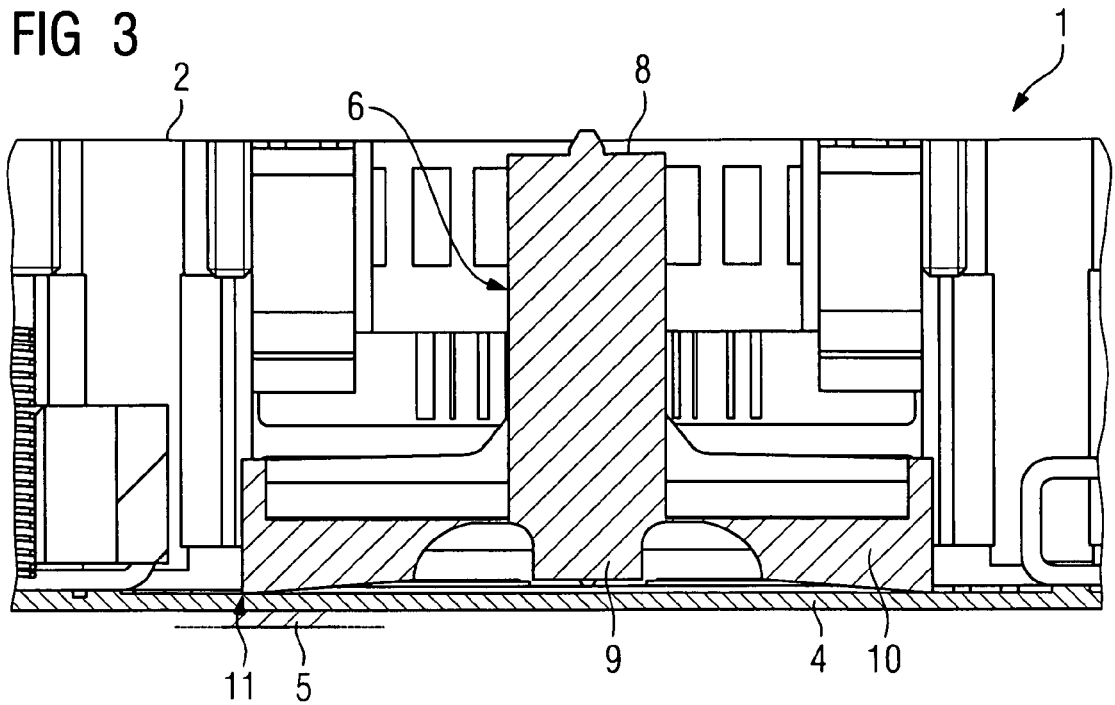
FIG. 3 shows a sectional illustration of the power semiconductor module with a supporting apparatus which is not completely pressed onto a substrate.
Figure 4:
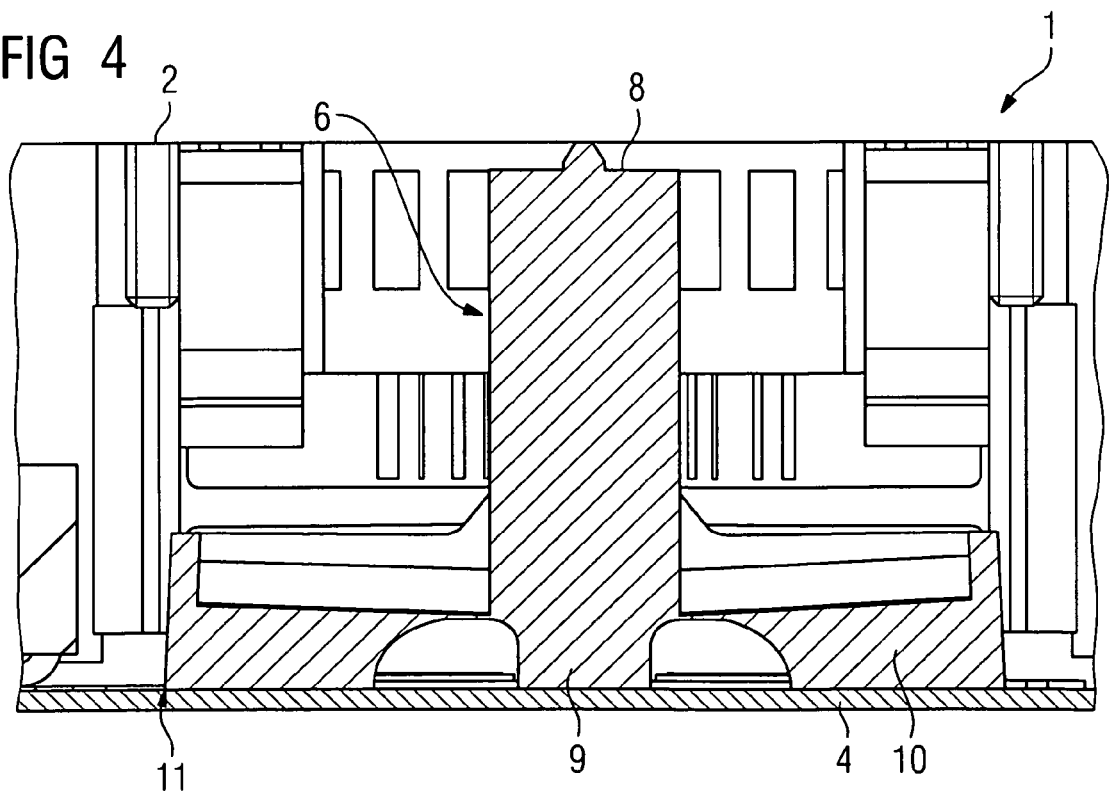
FIG. 4 shows, in an illustration similar to FIG. 3, the power semiconductor module with a supporting apparatus which rests completely on the substrate.

FIGS. 1 and 3 and 4 show different views of a power semiconductor module 1 comprising a plurality of components 3, namely power semiconductor components, which are arranged in a housing 2. The individual components 3 are situated on a plate-type substrate 4 which is in the form of a direct copper bonding (DCB) substrate. In the case of such a DCB substrate, a copper foil is applied to both sides of a ceramic plate in a direct bonding method. Situated under the substrate 4, that is to say on that side of the substrate 4 which is opposite the components 3, is a base plate 5 which is illustrated only by way of indication in FIG. 3, is fabricated from light metal, for example, and acts as a cooling element which dissipates heat generated in the components 3 via the substrate 4. The base plate 5 can be connected to cooling ribs in a manner which is not illustrated or can be integrally formed with such cooling ribs. The base plate 5 may also be a cooler through which a liquid medium flows or may be a component which is thermally conductively connected to such a cooler.

In order to reliably keep the substrate 4 in thermal contact with the base plate 5, a supporting apparatus 6 is braced between a busbar 7 which runs on the top side of the housing 2, that is to say is arranged on that side of the housing 2 which is opposite the cooling element 5, and the substrate 4. Apart from the busbar 7, the top side of the housing 2 is open. The supporting apparatus 6 is produced as a plastic part, for example in an injection-molding method, and has a central pressure bolt 8 which is oriented normal to the substrate 4 and to the base plate 5, is supported on the busbar 7 and is adjoined by a total of five stamps 9, 10 which rest on the substrate 4. The stamps 9, 10 which are integrally formed with the pressure bolt 8 comprise a central stamp 9, which is situated in a straight extension of the pressure bolt 8, and four lateral stamps 10 which extend essentially orthogonal to the pressure bolt 8 in the form of a star.

Figure 2:
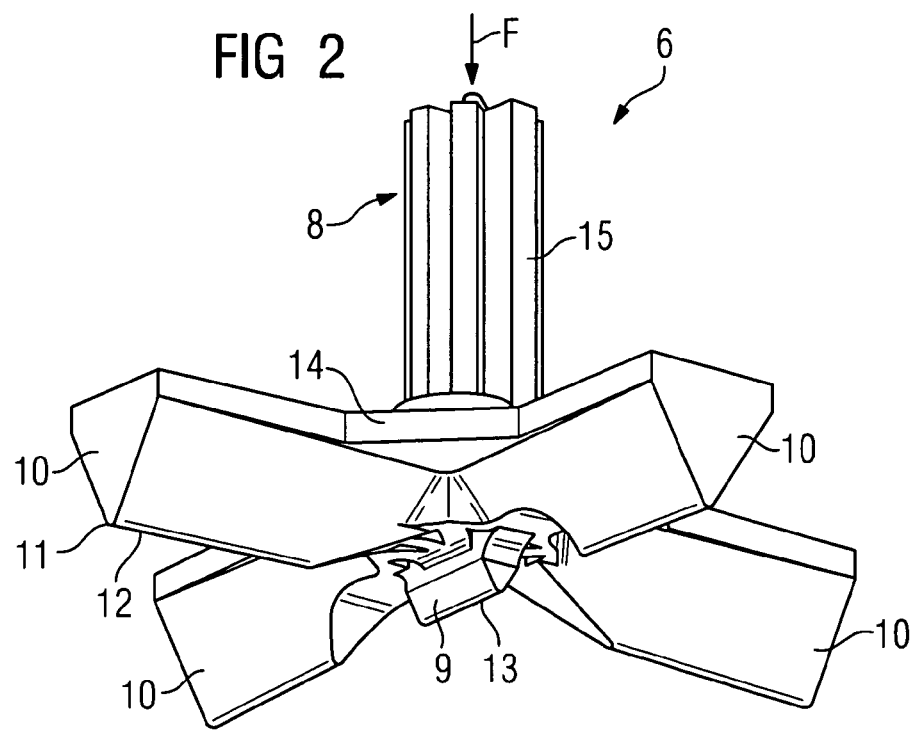
FIG. 2 shows the supporting apparatus of the power semiconductor module according to FIG. 1.

FIG. 3 shows the installation situation of the supporting apparatus 6 in the housing 2 when the pressure bolt 8 has not yet been mechanically loaded. In this case, only corner points 11 at the outer ends of the lateral stamps 10 rest on the substrate 4. In contrast, the central stamp 9 is completely raised from the substrate 4. As is evident from FIG. 2, in particular, each of the stamps 9, 10—also referred to as legs of the supporting apparatus 6—has a V-shaped cross section, only edges 12, 13 of the lateral stamps 10 or of the central stamp 9 being intended to rest on the substrate 4. Instead of pressing onto the substrate 4 directly, in embodiments which are not illustrated, the stamps 9, 10 may also press onto the substrate using intermediate pieces which are arranged on the substrate 4 or on components 3, as disclosed, in principle, in DE 35 08 456 C2, for example. In such a case, the distances between the stamps 9, 10 and the intermediate pieces, which act as force-transmitting elements, rather than the distances between the stamps 9, 10 and the substrate 4 are decisive for the method of operation of the supporting apparatus 6.

Each of the lateral stamps 10 is, on the one hand, at least slightly elastic per se and is, on the other hand, elastically connected to the pressure bolt 8 which is intended to be loaded with a force F. Reinforcing structures 14 which respectively connect two lateral stamps 10 to one another are formed in the region in which the lateral stamps 10 adjoin the pressure bolt 8. The elastic properties of the supporting apparatus 6 can be easily adapted to the boundary conditions existing in the individual case, for example the mechanical properties of the substrate 4, by varying these reinforcing structures 14, in particular. For the purpose of mechanical stabilization, the surface of the pressure bolt 8 has ribs 15 which run in the axial direction, that is to say in the direction of the force F.

If the pressure bolt 8 is loaded with a force in the direction of the base plate 5, for example using an adjusting screw which is not illustrated and is screwed into the busbar 7, the four lateral stamps 10 which are arranged in a symmetrical manner with respect to the pressure bolt 8 and are elastically articulated to the latter change from the positioning illustrated in FIG. 3 to the end position illustrated in FIG. 4 which shows the arrangement during intended operation of the power semiconductor module 1. In this case, the edges 12 of the lateral stamps 10 and the edge 13 of the central stamp 9 rest completely on the substrate 4 with a uniform application of pressure. Despite the narrow design of the edges 12, 13, the supporting apparatus 6 thus introduces force into the substrate over a relatively large area. At the same time, on account of the V shape of the stamps 9, 10, the supporting apparatus 6 takes up only a small amount of area on the substrate 4 which has been fitted with the components 3.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A power semiconductor module, comprising:
a plate-type substrate fitted with at least one component;
a base plate to dissipate heat from the component via the substrate; and
a supporting apparatus to keep the substrate in thermal contact with the base plate, the supporting apparatus including elastic properties including a central pressure bolt adjoined by a plurality of stamps which extend in different directions and are intended to contact-connect the substrate, the individual stamps being at non-uniform distances from the substrate in a mechanically unloaded state of the pressure bolt, and the supporting apparatus including a central stamp situated in an extension of the pressure bolt and a plurality of lateral stamps extending orthogonal to the pressure bolt and elastically connected to the pressure bolt in a resilient manner, at least the lateral stamps including a V-shaped cross section, and an edge of the stamp being intended to rest on the substrate.

2. The power semiconductor module as claimed in claim 1, wherein the central stamp is integrally produced with the pressure bolt and with the lateral stamps from plastic.

3. The power semiconductor module as claimed in claim 2, wherein the central stamp is at a greater distance from the substrate than the lateral stamps in the mechanically unloaded state of the pressure bolt.

4. The power semiconductor module as claimed in claim 3, wherein the lateral stamps are at an increasingly greater distance from the substrate toward the central stamp in the mechanically unloaded state of pressure bolt.

5. The power semiconductor module as claimed in claim 1, wherein the substrate is in the form of a direct copper bonding substrate.

6. The power semiconductor module as claimed in claim 1, wherein the pressure bolt is supported on a busbar on a side opposite the stamps.

7. The power semiconductor module as claimed in claim 6, wherein the busbar is fastened to a housing which holds at least one component and is open on a side on which the busbar is arranged.

8. The power semiconductor module as claimed in claim 2, wherein the substrate is in the form of a direct copper bonding substrate.

9. The power semiconductor module as claimed in claim 2, wherein the pressure bolt is supported on a busbar on a side opposite the stamps.

10. The power semiconductor module as claimed in claim 9, wherein the busbar is fastened to a housing which holds at least one component and is open on a side on which the busbar is arranged.

11. The power semiconductor module as claimed in claim 3, wherein the substrate is in the form of a direct copper bonding substrate.

12. The power semiconductor module as claimed in claim 3, wherein the pressure bolt is supported on a busbar on a side opposite the stamps.

13. The power semiconductor module as claimed in claim 12, wherein the busbar is fastened to a housing which holds at least one component and is open on a side on which the busbar is arranged.

14. The power semiconductor module as claimed in claim 4, wherein the substrate is in the form of a direct copper bonding substrate.

15. The power semiconductor module as claimed in claim 4, wherein the pressure bolt is supported on a busbar on a side opposite the stamps.

16. The power semiconductor module as claimed in claim 15, wherein the busbar is fastened to a housing which holds at least one component and is open on a side on which the busbar is arranged.

17. The power semiconductor module as claimed in claim 5, wherein the pressure bolt is supported on a busbar on a side opposite the stamps.

18. The power semiconductor module as claimed in claim 17, wherein the busbar is fastened to a housing which holds at least one component and is open on a side on which the busbar is arranged.

* * * * *